United States Patent [19]
Robinson

[11] Patent Number: 5,804,847
[45] Date of Patent: Sep. 8, 1998

[54] BACKSIDE ILLUMINATED FET OPTICAL RECEIVER WITH GALLIUM ARSENIDE SPECIES

[75] Inventor: Gerald D. Robinson, Santa Barbara, Calif.

[73] Assignee: The United States of America as represented by the Secretary of the Air Force, Washington, D.C.

[21] Appl. No.: 577,995

[22] Filed: Dec. 22, 1995

Related U.S. Application Data

[62] Division of Ser. No. 274,931, Jul. 14, 1994, Pat. No. 5,663,075.

[51] Int. Cl.$^6$ ................... H01L 29/80; H01L 31/0288; H01L 31/112
[52] U.S. Cl. ................... 257/257; 257/284; 257/462
[58] Field of Search ................... 257/357, 382, 257/462, 486, 39, 170, 175, 225, 257, 496, 618, 619, 623, 280, 284

[56] References Cited

U.S. PATENT DOCUMENTS

| | | | |
|---|---|---|---|
| 3,749,987 | 7/1973 | Anantha | 317/235 |
| 4,198,646 | 4/1980 | Alexander et al. | 357/30 |
| 4,321,613 | 3/1982 | Hughes et al. | 357/22 |
| 4,523,368 | 6/1985 | Feist | 29/571 |
| 4,624,004 | 11/1986 | Calviello | 257/276 |
| 4,632,710 | 12/1986 | Van Rees | 148/175 |
| 4,642,883 | 2/1987 | Sakurai et al. | 29/576 |
| 4,677,735 | 7/1987 | Malhi | 29/571 |
| 4,688,062 | 8/1987 | Liles | 257/284 |
| 4,782,375 | 11/1988 | Popiovic | 357/27 |
| 4,849,376 | 7/1989 | Balzan et al. | 437/228 |
| 4,908,325 | 3/1990 | Berenz | 437/40 |
| 5,008,213 | 4/1991 | Kolesar, Jr. | 437/51 |
| 5,150,182 | 9/1992 | Capps et al. | 357/30 |
| 5,373,191 | 12/1994 | Usagawa et al. | 257/773 |

FOREIGN PATENT DOCUMENTS

| | | | |
|---|---|---|---|
| 405152561 | 6/1993 | Japan | 257/453 |

OTHER PUBLICATIONS d'Heurle et al., Field Effect Transistors Utilizing Schottky Barrier Principle, IBM Technical Disclosure Bulletin vol. 9 No. 10, pp. 1470–1471, Mar. 10, 1967.

*Primary Examiner*—Ngân V. Ngô
*Attorney, Agent, or Firm*—Gerald B. Hollins; Thomas L. Kundert

[57] ABSTRACT

A photo FET device having a large area backside optical energy reception surface is disclosed. The photo FET device is fabricated in the source gate and drain upward configuration and then inverted onto a new permanent substrate member and an original surrogate substrate member removed in order to expose the active area backside optical energy reception surface. Electrical characteristics including curve tracer electrical data originating in both dark and illuminated devices and devices of varying size and both depletion mode and enhancement mode operation are also disclosed. Fabrication of the device from gallium arsenide semiconductor material and utilization for infrared energy transducing in a number of differing electronic applications are also disclosed.

21 Claims, 3 Drawing Sheets

BACKSIDE ILLUMINATED FET OPTICAL RECEIVER WITH GALLIUM ARSENIDE SPECIES

This application is a division of U.S. application Ser. No. 08/274,931, filed Jul. 14, 1994, now U.S. Pat. No. 5,663,075. +gi

RIGHTS OF THE GOVERNMENT

The invention described herein may be manufactured and used by or for the Government of the United States for all governmental purposes without the payment of any royalty.

CROSS REFERENCE TO RELATED APPLICATIONS

The present document is somewhat related to the copending and commonly assigned applications "FET Optical Receiver Using Backside Illumination, Indium Phosphide Species Method", Ser. No. 08/274,930; "Wafer Joined Opto-Electronic Integrated Circuits Method", Ser. No. 08/274,882, now U.S. Pat. No. 5,472,914; and "Backside Illuminated MSM Device Method", Ser. No. 08/274,889; which are filed of even date herewith in the names of different inventors. The contents of these related applications are hereby incorporated by reference herein.

BACKGROUND OF THE INVENTION

This invention relates to the field of an optical to electrical signal transducer devices and their fabrication in the form of a field effect transistor (FET).

In providing semiconductor devices for transducing optical energy signals into electrical energy signals, it has become generally accepted that the field effect transistor provides something less than an optimum arrangement as starting point for achieving the desired optical-to-electrical signal conversion or signal transducing. Although a number of effects contribute to this less than optimum starting point status, one especially significant consideration relates to the presence of optical energy-obscuring structure, including source, drain and gate-related metallic conductor members, dispersed over the same transistor surface to receive an optical energy signal in the typical FET arrangement. In many FET arrangements these conductors, which communicate with the source, drain and gate elements of the transistor, occupy such a major portion of the transistor's surface area as to relegate the remaining area usable for optical energy reception to less than 50% of the overall surface of the transistor.

In addition to this obscured surface area difficulty, when a GaAs FET structure is epitaxially grown onto a single crystal GaAs host substrate an interface is formed which creates a partial depletion of carriers at the interface. When the FET is fabricated this 'built-in' depletion layer may act in opposition to the desired depletion region created by the Shottky barrier gate. This is not a severe problem for most typical applications of FETs, where the FETs are used for electrical amplification and modulation. If the FET is to be used as a photodetector, however, the "built-in" depletion region will undesirably limit the gain and modulation characteristics of the device. In addition, if the FET is inverted and the GaAs substrate removed, an air to active layer interface is created which also has a 'built-in' depletion layer. This layer may actually enhance the achieved photoconductance since photons can be injected into the active layer.

Notwithstanding these phenomenon, there are a number of advantages in achieving an efficient photo transducing field effect transistor (i.e., a photo FET or OPFET). The availability of electrical signal amplification within the transducer device itself is, of course, one of the inherent advantages of a practical photo FET. The overall simplicity of a photo FET device and the possible fabrication material compatibility with integrated circuit devices are additional advantages to be achieved from an acceptable photo FET arrangement. In addition, the ability to perform processing on both sides of the device in a photo FET device such as that of the present invention an opportunity to create structures which have heretofore been impossible, for example, opposed-gate FETs and counter-electrode configurations, to tailor depletion regions and create ballistic (super fast) devices. Anti-reflection coatings, such as, silicon nitride, $Si_3N_4$; silicon oxides SiO, $SiO_2$; and wavelength filtering dielectrics can easily be applied to the exposed active layer using conventional evaporation or sputtering equipment. Moreover, passive and/or active devices, e.g., vertical cavity lasers (VCLs), can be bonded to the backside of such an OPFET to create an optical transceiver assembly.

The U.S. Patent art indicates the presence of considerable inventive activity, especially with respect to the MESFET (metal semiconductor field effect transistor) device and its use as an electrical circuit element. Prior patent activity, however, appears limited in the area of photo optical transducing MESFET devices as is disclosed herein.

Previous MESFET related patents include the patent of U.K. Mishra et al., U.S. Pat. No. 5,180,681, which is concerned with the fabrication of a high current high voltage breakdown field effect transistor of the MESFET type, including the fabrication of such devices with gallium arsenide material. In addition the invention of S. Inmamura et al., in U.S. Pat. No. 5,204,278, discloses a use of Group III-V periodic table semiconductor compounds such as gallium arsenide and the configuration of a MESFET device to include a Shottky gate electrode arrangement. In addition, the invention of E. Kolesar Jr. in U.S. Pat. No. 4,989,063 is of general background interest with respect to the present invention in the sense that it discloses use of an epoxy adhesive during a semiconductor device fabrication sequence.

Neither the application of the MESFET configuration to optical transducing service nor the improved configuration of a MESFET device for this usage is known to have been accomplished however.

SUMMARY OF THE INVENTION

The present invention provides a photo FET device, particularly a device of the MESFET type, which overcomes at least one important disadvantage of previous photo devices by providing unobstructed access to the device's active region by incident optical energy. The device of the invention also provides desirable high frequency characteristics and desirable optical spectrum response. These advantages and improved optical efficiency are achieved in the device of the invention through among other things, "backside" illumination of the device's charge carrier transport region—i.e., by burying the necessary source gate and drain electrodes and their accompanying metalizations on the substrate side of the FET structure thereby maintaining the backside surface unencumbered for optical energy reception. The achievement of this transistor configuration is enabled by use of a substrate removal sequence during fabrication of the photo FET. The substrate removal is achieved in either of two disclosed manners during this sequence. The invention also includes a particular semiconductor material species embodiment of the FET device and its fabrication.

It is an object of the present invention therefore, to provide an optically efficient photo FET device.

It is another object of the invention to provide a photo FET device in which substantially one hundred percent of the device's charge transport region surface area is made available for optical energy impingement.

It is another object of the invention to provide a high-speed photo FET device.

It is another object of the invention to provide a photo FET device which can be fabricated with gallium arsenide-inclusive semiconductor materials.

It is another object of the invention to provide an optical to electrical transducer device which affords electrical signal gain properties in addition to optical signal to electrical signal transducing capability.

It is another object of the invention to provide a photo FET device which may be fabricated in a plurality of different physical size and physical arrangement configurations.

It is another object of the invention to provide a practical method of fabricating an upside-down photo field effect transistor device.

It is another object of the invention to provide an inverted photo FET transistor which can be achieved through substrate removal and replacement fabrication techniques.

It is another object of the invention to provide a photo FET device having a particularly useful and possibly double ranged optical spectrum response characteristic.

Additional objects and features of the invention will be understood from the following description and claims and the accompanying drawings.

These and other objects of the invention are achieved by a partially fabricated gallium arsenide photo field effect transistor having a subsequently removable surrogate substrate-covered, wide angle orthogonal path, unobstructed planar optical energy window, said photo field effect transistor comprising:

a plurality of field effect transistor-comprising planar semiconductor layers received on a horizontally disposed gallium arsenide surrogate first substrate member, said semiconductor layers including an aluminum arsenide etch stop sacrificial layer received over said surrogate first substrate member, an n– gallium arsenide layer received over said stop etch sacrificial layer, and an n+ gallium arsenide layer received over said n– gallium arsenide layer;

said semiconductor layers received on said surrogated first substrate member being laterally terminated in sloping orthogonal component-inclusive boundary lines defining sidewall portions of an upstanding transistor mesa, a transistor mesa having a crown surface comprising an exposed surface of said n+ gallium arsenide layer;

field effect transistor source and drain electrodes received on laterally opposed extremities of said mesa crown surface n+ gallium arsenide layer, said transistor source and drain electrodes having ohmic electrical connection with said n+ gallium arsenide layer at said mesa crown surface;

source and drain electrode-connected metal conductor members extending down laterally opposed sidewall portions of said mesa to contact pads located on laterally opposed surface regions of said surrogate first substrate member adjacent said mesa sidewall portions;

a gate well recess centrally disposed in said mesa crown surface intermediate said transistor source and drain electrodes and extending through said n+ gallium arsenide layer down to a gate recess region of reduced layer thickness in said n– gallium arsenide layer, a remaining thickness portion of said n– gallium arsenide layer below said gate recess region comprising a laterally extending charge carrier flow controlling channel region of said transistor;

a metallic gate member received over said laterally extending charge carrier flow controlling channel region in said gate recess region of said n– gallium arsenide layer, said metallic gate member having Schottky barrier electrical characteristics with respect to said n– gallium arsenide layer semiconductor material;

a layer of electrically insulating filler material covering said metal conductor members, said mesa sidewall portions, said contact pads, exposed surface regions of said surrogate first substrate member and also filling void regions of said gate well recess surrounding said metallic gate member; said layer of electrically insulating filler material having a planar upper surface disposed in coplanar relationship with upper surface portions of said metallic gate member and said source and drain electrode-connected metal conductor members;

a heat conductive epoxy adhesive layer received on said planar upper surface, said metallic gate member and said source and drain electrode-connected metal conductor members; and a permanent second substrate member attached by said adhesive layer to said filler material planar upper surface, said metallic gate member and said source and drain electrode-connected metal conductor members of said transistor;

whereby a subsequent removal of said gallium arsenide surrogate first substrate member and said aluminum arsenide etch stop sacrificial first layer exposes a light sensitive unobstructed wide angle orthogonal path planar optical input window backside surface of said laterally extending charge carrier flow-controlling channel region of said then second substrate member-supported photo field effect transistor.

DETAILED DESCRIPTION

Figure 1A:
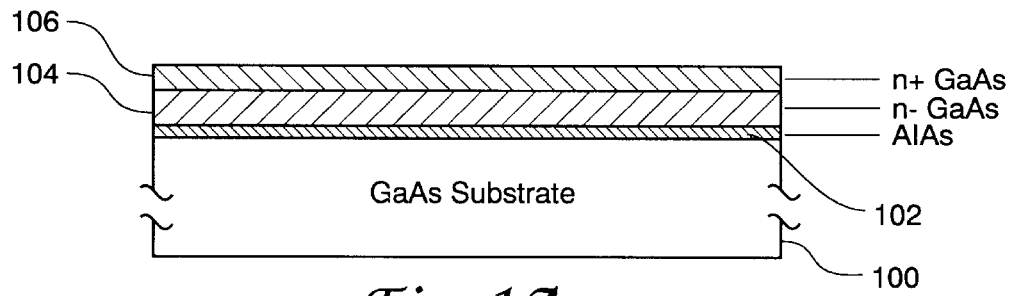
FIG. 1A shows the first step in a sequence for fabricating a photo FET in accordance with the invention.

FIG. 1A through FIG. 1D in the drawings shows a condensed four-step sequence for fabricating photo FET devices of the MESFET type in accordance with the present invention. The four steps of the FIG. 1 process are described in the views of FIGS. 1A, 1B, 1C and 1D, where the results of individual acts in the fabrication sequence are shown in graphic representation. In the FIG. 1A through FIG. 1D views as well as in the views of other figures in the present description, the original number identification of a represented element is maintained in successive veiws, even though newly appearing elements are provided with numbers having a hundreds digit corresponding to subsequent drawing figure numbers.

FIG. 1A in the drawings shows the results of a first series of acts in the device fabrication sequence. In the FIG. 1A drawing, a single crystal surrogate or temporary substrate member 100 which may be composed of semi-insulating gallium arsenide is provided with a thin stop etch layer 102 which may be composed of such material as aluminum arsenide. Overlaying the layer 102 is a thicker layer 104 which may be composed of material such as n– type gallium arsenide. The layer 104 is in turn covered by a layer of n+ gallium arsenide as indicated at 106. The gallium arsenide material of the n– layer 104 is preferably doped with silicon to a doping concentration of $2-4 \times 10^{17}$ ions/cm$^3$. In a similar manner the gallium arsenide in the n+ layer 106 is preferably doped with silicon to a doping concentration of $2-3 \times 10^{18}$ ions/cm$^3$. The aluminum arsenide layer 102 preferably includes an aluminum concentration of 50%. Aluminum arsenide material is particularly desirable for use in the layer 102 of the present device because of its susceptibility to hydrofluoric acid etching and its relatively inert response to etches which attack the gallium arsenide of the surrogate or temporary substrate member 100. These characteristics are relied upon in the subsequent processing of the FIG. 1A structure.

Each of the FIG. 1A through FIG. 1D layers, 102, 104, and 106 may be formed by the use of conventional techniques such as molecular beam epitaxy (MBE), Metal Organic Chemical Vapor Deposition (MOCVD), ion implantation, or other techniques as are known in the semiconductor art. Already fabricated wafers having layers in the nature of the layers 102, 104, and 106 are often available from semiconductor manufacturers and provide a convenient starting point for the FIG. 1A through FIG. 1 fabrication.

FIG. 1A in the drawings therefore shows the appearance of the FIG. 1A through FIG. 1 wafer following performance of several layer forming conventional transistor fabrication steps—steps performed in order to ultimately achieve an inverted MESFET device. Persons skilled in the transistor fabrication art will appreciate that the thickness of the layers 102, 104 and 106 in FIG. 1A may be varied over a considerable range according to the transistor characteristics and material properties involved. For present purposes however, layer thicknesses of 500 Angstroms (Å), 1500 Å, and 500 Å respectively for the layers 102, 104, and 106 are typical.

Figure 1B:
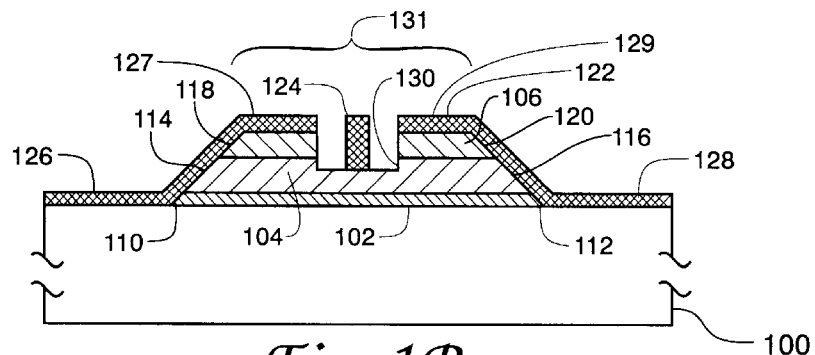
FIG. 1B shows a second step in fabricating a photo FET according to the invention.

In the FIG. 1B drawing, the n– type gallium arsenide layer 104 has been laterally terminated at the sloping lines 114 and 116, the n+ layer at 106 has been terminated at 118 and 120 and the aluminum arsenide layer 102 terminated at 110 and 112. The upstanding structure in FIG. 1B may be generally referred to as a mesa having a generally trapezoidal shape. In the FIG. 1B structure, a fourth layer 122 preferably of a metal such as nickel gold germanium (NiAuGe) has been formed as an alloyed ohmic contact over the top of the n+ gallium arsenide layer 106. This fourth metal layer extends over the sloping termination regions 110, 114, 118, 112, 116, and 120 onto the exposed surfaces of the substrate 100 in the contact or pad regions 126 and 128. The metallic film of the layer 122 may have a thickness in the range of 1000 Å–2000 Å; and this layer may be accomplished by E beam evaporation and subsequent alloying at about 450° C.

In the recessed or well area 130, one of a variety of possible metals, such as titanium gold (TiAu), titanium platinum gold (TiPtAu), Aluminum (Al) etc. extends down to the recessed surface of the n– layer 104 to form a "Schottky barrier gate electrode" or Schottky gate structure 124. The depth of the recess at 130 is of course determinative of the resulting transistor device's electrical properties including its characterization as a depletion mode or enhancement mode device. Excepting for the stop etch layer 102, the FIG. 1B illustrated transistor structure is therefore in resemblance of a conventional MESFET device—as may be employed for electrical switching and electrical signal amplification purposes.

Figure 1C:
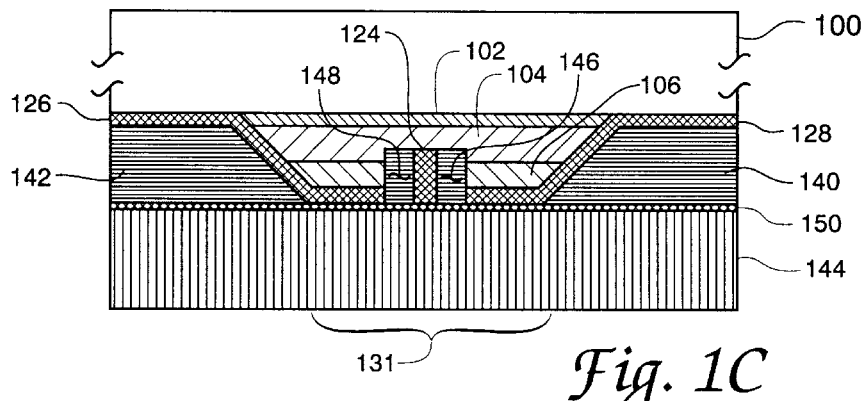
FIG. 1C shows a third step in the fabrication of a photo FET according to the invention.

FIG. 1C in the drawings shows a third step in the condensed fabrication sequence for a photo FET device according to the present invention. In the FIG. 1C drawing, the substrate 100 and the transistor formed thereon in the steps of FIG. 1A and FIG. 1B is shown to be in an inverted, buried frontside or topside down position and is attached to a second and permanent substrate member 144 generally at the transistor's buried frontside portion 131. The same frontside portion of the FIG. 1 transistor is more clearly identified at 131 in FIG. 1B prior to becoming "buried" in the inversion of the FIG. 1C step. Attachment of the transistor and substrate assembly from the FIG. 1B drawing to the substrate 144 is accomplished by way of a layer 150 of material such as a heat conducting epoxy adhesive, an adhesive such as the type H74 which is made by Epoxy Technology Company located in Billerica, Mass. for example. The layer 150 in FIG. 1C and 1D may be generally referred to as an "adhesive layer" in embodiments of the invention using this attachment arrangement. The substrate 144 may be fabricated of alumina, beryllium oxide, aluminum nitride, glass, gallium arsenide, or other semiconductor materials or from a variety of other materials. In addition to an epoxy adhesive bond to the substrate 144, a plasma chemical vapor deposition, PCVD, aluminum nitride or diamond material layer may also be used to achieve the second substrate member 144 attachment in FIG. 1C.

In addition to this physical inversion and new substrate attachment of the FIG. 1B transistor in the view of FIG. 1C, there is also shown in FIG. 1C a filling of the unoccupied spaces adjoining the transistor elements. These filled areas are indicated at 140, 142, 146 and 148 in the FIG. 1C. drawing. Preferably, this filling is accomplished by application of epoxy to the FIG. 1B structure prior to the FIG. 1C bonding to the substrate 144, an application using a vacuum compression and heating process as is well known in the semiconductor device fabrication art.

The second and permanent substrate member 144 in FIG. 1C may have any desired thickness however for most uses, a thickness in the range of 0.01 inch to 0.025 inch is desirable. With the addition of this second permanent substrate member, the GaAs surrogate substrate member 100 is subjected to a lap and polish operation in order to achieve a thickness of 50 to 60 microns. Following this lap and polish operation on the surrogate GaAs substrate 100, the remainder of this substrate is removed using a selective chemical and/or a reactive ion etching procedure as are known in the semiconductor art. This selective etching will react with the remainder portions of the gallium arsenide surrogate substrate member 100, but not with the aluminum arsenide of the stop etch layer 102. The aluminum arsenide material of the stop etch layer 102 is removed using a dilute hydrofluoric acid etch.

Removal of the stop etch layer 102 has of course achieved the desired exposure of the backside portion of the active region of the FIG. 1A through FIG. 1D photo FET device. Upon completion of the removal of the stop etch layer 102 therefore, the thus-far fabricated photo FET can be electrically and functionally tested prior to further fabrication steps by setting probes on the exposed metal contact regions at 126 and 128. These regions are in fact the contact regions for the source and drain elements of the FIG. 1 photo FET. Similar testing contact may be made with the metal of the Schottky gate member 124 in the portions thereof extending out from under the layer 104 at locations below the page or on top of the page of the FIG. 1C drawing, portions of the gate 124 (such as 208) which are visible in FIG. 3B of the drawings herein. Optical to electrical signal transducing function testing of the FIG. 1C structure can of course be accomplished by providing both an optical signal and electrical energization during this probe operation of the FIG. 1C device.

Figure 1D:
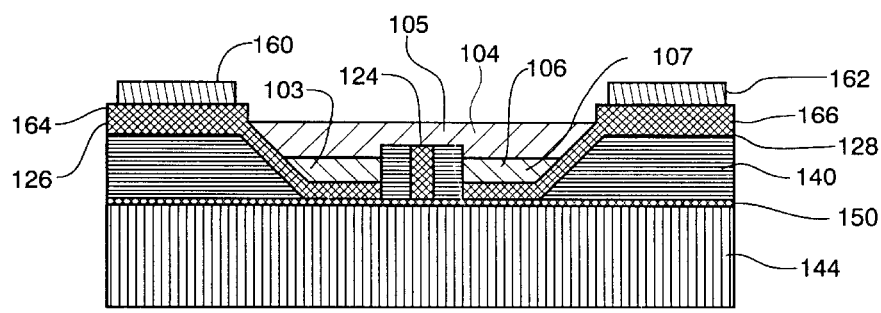
FIG. 1D shows a fourth step in the fabrication of a photo FET in accordance with the present invention.

FIG. 1D in the drawings shows the addition of bonding metallization in the form of adding additional thickness to the contact regions at 126 and 128. This additional thickness is shown at 164 and 166 in FIG. 1D; FIG. 1D also shows addition of the bonding connection pads at 160 and 162. The added metallization at 164 and 166 in FIG. 1D, in comparison with the metallization at 126 and 128 in FIG. 1C, allows easier wire bonding to the hard eutectic material of the contact regions at 126 and 128 and may be comprised of titanium gold (TiAu) or titanium platinum gold (TiPtAu) added to the nickel gold germanium of the pads at 126 and 128—ie. to the pads 126 and 128 which connect with the pads 127 and 129 making ohmic connection with the n+ gallium arsenide of the layer 106.

An alternate arrangement of the FIG. 1D device may be used in order to avoid the temperature limitations inherent in a gold-based ohmic contact—that is, to avoid the operating sequence wherein gold tends to migrate into the active region of the device at operating temperatures just above 125° C. In this alternate arrangement, refractory ohmic contacts may be employed. Such contacts may be fabricated of germanium molybdenum tungsten (GeMoW), for example, as has been disclosed in the French work of Chevalier and by others such as Merikami at Bellcor, for example. With such refractory metal contacts at 126, 128 and also at the gate 124, MESFET operation up to the temperature range of substrate electrical conductivity are possible. With substrate removal, as in the present invention, even higher operating temperatures are possible. (The companion patent document of H. Lee et al., Ser. No. 08/254, 722, U.S. Pat. No. 5,416,902, is of some interest in this regard and is hereby incorporated by reference herein.)

It is interesting to note that a substrate removal arrangement therefore leads to both higher temperature operating capability in MESFET devices and also enables the benefits of backside illumination of a MESFET photodevice. Viewed from another perspective, the present invention device with its absence of a temperature limiting substrate and provided with refractory metal contacts, enables a desirable high temperature operating capability that extends well beyond the 125° C. range and possibly to the 400° C. range.

In the photo FET device of FIG. 1D, the region 103 functions as the transistor source, the region 105 as the transistor channel region and the region 107 as the transistor drain. As with many FET devices, however, source and drain regions may be interchanged in an electrical circuit use of the device.

Other variations of the FIG. 1 disclosed photo FET fabrication are of course possible. In particular it is possible to employ thin film peeling techniques wherein an etching away of the stop etch layer 102 is accomplished in order to release the uppermost layers of the transistor device in FIG. 1B from the substrate 100 for remounting. When such thin film peeling fabrication is employed, it may be desirable to remove the initial substrate 100 either before or after attachment to the permanent second substrate 144, depending on the overall fabrication techniques employed. Since the handling of peeled thin film transistor devices is a matter of considerable art, the herein-described inverted substrate removal-related fabrication process is believed preferable.

Figure 2A:
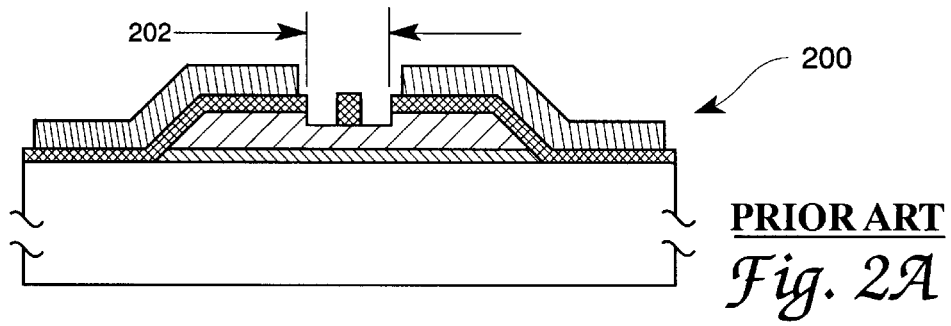
FIG. 2A shows the illumination area and other details of a conventional photo MESFET device.
Figure 2B:
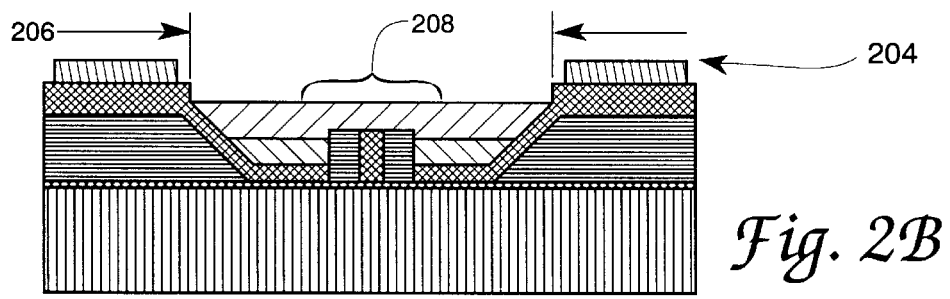
FIG. 2B shows a photo MESFET according to the present invention in comparison with the FIG. 2A device.

FIG. 2A and FIG. 2B in the drawing shows a comparison of the photo FET device of FIG. 1D in the FIG. 1A through FIG. 1D fabrication sequence with a conventional MESFET device. FIG. 2A and FIG. 2B employs vertically aligned views with the FIG. 2A and FIG. 2B drawings, views which allow graphic comprehension of the changes accomplished in devices made in accordance with the present invention. FIG. 2A therefore, shows at 200 a conventional MESFET device, a device having a possible optical energy receiving active region of the dimension indicated at 202. In contrast with this FIG. 2A conventional MESFET device, a MESFET device made according to the present invention is shown at 204 in FIG. 2B of the drawings. In the device 204, the optical energy receiving active region or exposed backside portion is indicated at 206. Clearly the greater extent of this optical energy receiving active region in the photo FET of FIG. 2B is desirable for better utilization of an incident optical energy signal than is the source and drain and gate metallization obscured active region at 202 in the conventional MESFET device 200. The wide angle port and unobscured optical access to the gate-attending region, indicated at 208 for the FIG. 2B MESFET device, is particularly desirable since this region proximate the Schottky gate structure is particularly effective for optical energy transducing purposes.

Figure 3A:
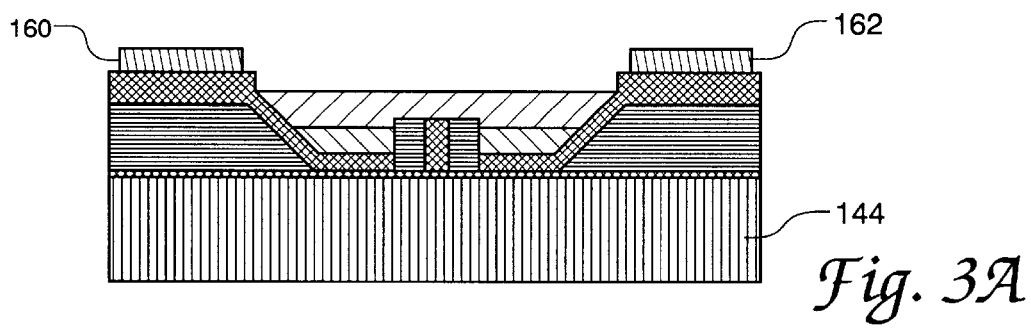
FIG. 3A shows a profile view of a MESFET device according to the present invention.
Figure 3B:
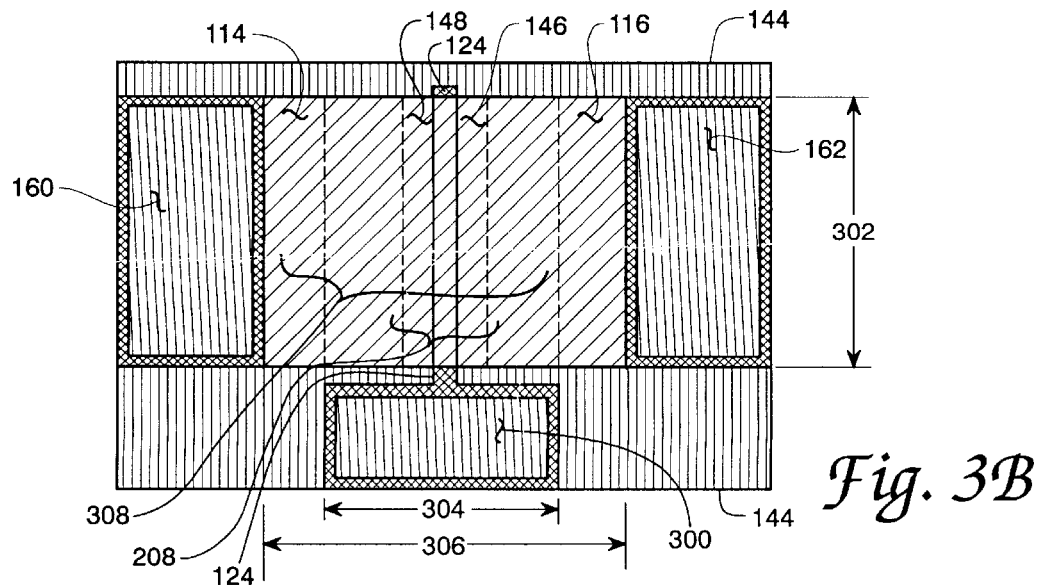
FIG. 3B shows a plan view of the FIG. 3A device.

FIG. 3A and FIG. 3B in the drawings show elevation and plan representations of the present invention photo FET device as fabricated according to the FIG. 1A through FIG. 1D sequence. In the FIG. 3A and FIG. 3B views, lines indicating the Schottky gate element 124 for example, are vertically aligned, as are lines representing other portions of the photo FET device. The element numbers used in the FIG. 1A through FIG. 1D sequence are repeated in the FIG. 3 drawings and elements newly appearing in FIG. 3A and FIG. 3B are provided with numbers in the 300 series. The FIG. 3 newly appearing elements in FIG. 3B include the bonding connection pad 300 for the Schottky gate member 124 and a lengthwise extent definition of the bonding connection pads 160 and 162. The pads at 300, 160, and 162 have dimensions 304 and 302 which are in the order of 200 $\mu m \times 100\ \mu m$ for a two hundred micron device embodiment of the invention, for example. The optical energy receiving or source to drain charge carrier flow region 308 in FIG. 3B may have a length 306 of 300–400 μm for the 200 micron sized device referred to above.

Figures 4A, 4B:
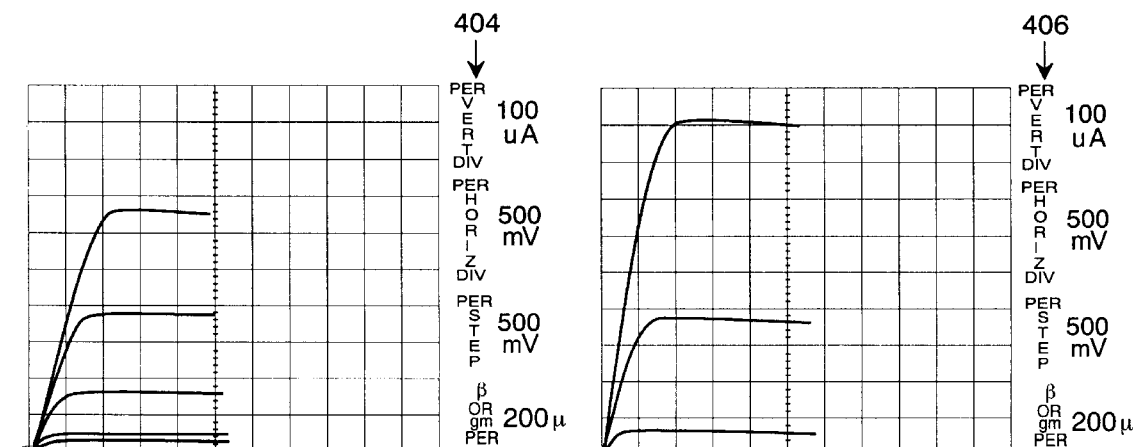
FIG. 4A shows the current vs. voltage characteristics for a MESFET according to the invention under dark conditions.
FIG. 4B shows the MESFET characteristics of FIG. 4A as altered by the presence of illuminating optical energy.

A principal electrical characteristic of interest with respect to the photo FET devices shown in FIGS. 1A through FIG. 3B is of course the response of the transistor's $I_{ds}$ current to the incidence of optical energy. Several aspects of this optical energy response are indicated in FIG. 4A through FIG. 6B of the drawings herein. In the drawings of this group, for example, FIG. 4A shows at 400 the current versus voltage characteristics of a typical 200 micron MESFET according to the invention before the surrogate substrate 100 is removed (i.e., the dark characteristics of a typical 200 micron device). The FIG. 4A drawing originates with a display of device characteristics on a curve tracing instrument, an instrument such as is manufactured by Techtronics Inc. of Beaverton, Oreg. The vertical and horizontal sensitivities of the curve tracer for the FIG. 4A display as well as the gate voltage increase for each of the constant current curves above the first curve in FIG. 4A and the transconductance ($g_m$) increment for each of the uppermost four curves in the FIG. 4A drawing are indicated in the vertical array of information at 404 in FIG. 4A. As indicated in this vertical array, each vertically disposed increment of the background grid in FIG. 4A represents a current change of 100 microamps, each horizontal increment a change of 500 millivolts, each successive curve a gate voltage increase of 500 millivolts and each successive curve at 400 a transconductance change of 200 micromhos.

Since the array numbers at 406 in the FIG. 4B drawing are identical to those at 404 in FIG. 4A, the curve families 400 and 402 in these drawings, i.e., the dark and illuminated characteristics of a photo FET according to the invention, are directly comparable. These families illustrate the response of a photo FET according to the invention, a device of 200 micron nominal size, i.e., 200 microns by 50 microns active area with a 1 micron by 200 micron gate area, to an incident illumination in the range of 0.1–0.2 mW/cm² at 0.8–1.0 nanometer wavelength. This response may be appreciated, for example, by comparing the FIG. 4A and 4B drawings and realizing that the FIG. 4B top curve represents a current of about one and one-half times that shown in FIG. 4A. This current increase is in response to the incident "backside" surface illumination in the FIG. 4B curves 402.

Figure 5:
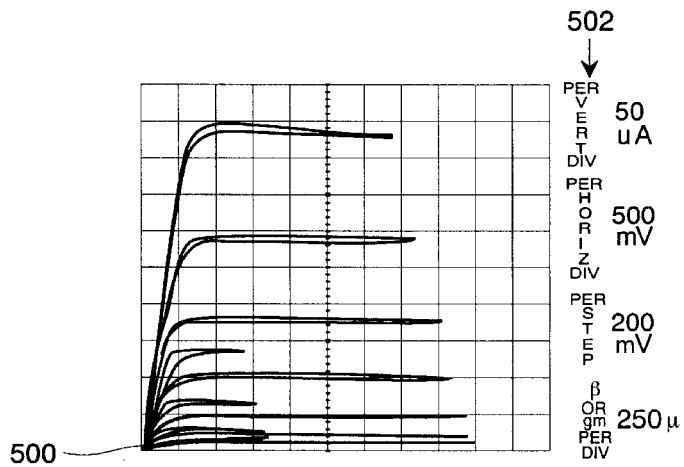
FIG. 5 shows the current vs. voltage characteristics for a smaller MESFET device having no substrate and both low level and higher level illumination.

FIG. 5 in the drawings shows two curves of the FIG. 4A and 4B type in superimposed relationship for the case of a smaller 10 micron size MESFET device fabricated according to the invention. In the FIG. 5 drawing an optical illumination of 1.0–2.0 mW/cm² at 0.9 nm wavelength is used in obtaining the higher current values. The two families of curves represented at 500 in FIG. 5 are obtained with differing curve tracer settings from FIG. 4A and FIG. 4B as may be noted at 502 in the FIG. 5 drawing.

Figures 6A, 6B:
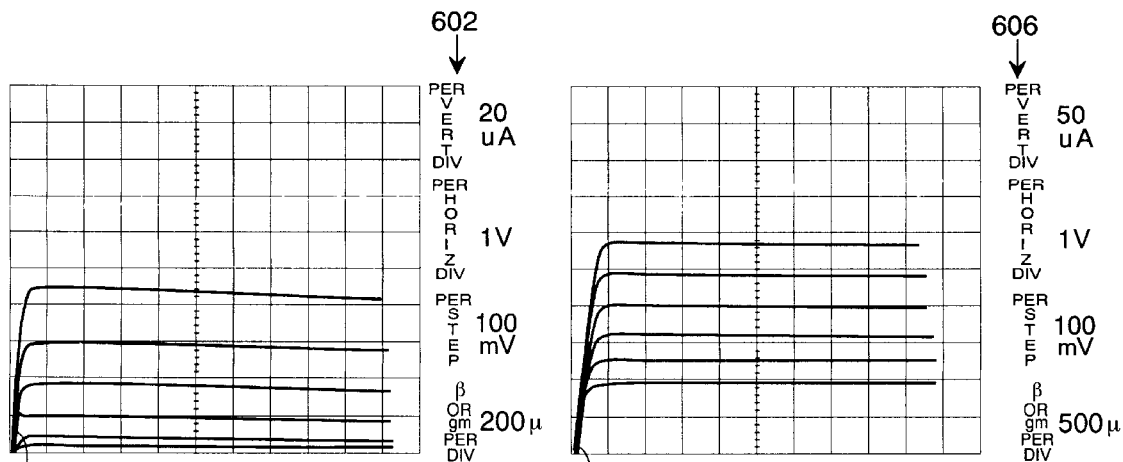
FIG. 6A shows the depletion mode characteristics of a small MESFET device according to the invention.
FIG. 6B shows the current vs. voltage characteristics for a small MESFET device according to the invention while operating in the enhancement mode.

FIG. 6A and FIG. 6B in the drawings show a comparison between the depletion mode and enhancement mode performance of a ten micron MESFET device fabricated in accordance with the present invention. As in the case of FIG. 5, the curve tracer settings for the families of curves indicated at 600 and 604 in FIG. 6A and FIG. 6B are different, the appropriate settings being indicated at 602 and 606 in FIGS. 6A and 6B, respectively.

The photo FET of the present invention therefore provides a desirable large area active region surface for the reception of incident optical energy while maintaining the also desired closer spacing of the source and drain electrodes of the transistor. The disclosed photo FET thereby avoids the performance degradation that has attended previous attempts to increase the size of an optical energy reception area in a photo FET device. The photo FET of the present invention is also improved over previous such devices in that the permanent substrate i.e. the substrate 144 in FIGS. 1C and 1D is separated from the semiconductor material 104 of the charge transport region of the transistor by the transistor's source and drain elements. As a result of this separation, undesirable surface effects and contamination of the transistor's active area by substrate-originating contamination is precluded.

As may also be appreciated by persons skilled in the transistor electrical circuit design art, the combination of an optical-to-electrical transducer with a transister having electrical amplification, as may be achieved in the devices of the present invention, offers significant circuitry advantages. This combination, for example, provides an opportunity for both reduced active device count in a circuit arrangement and also offers opportunities for reducing the presence of white noise and other thermal effects in the output signal. Such thermal effects are commonly encountered in both optical-to-electrical transducers and in the low signal level first amplifying stage that follows other types of optical-to-electrical transducer devices in a particular circuit application.

The photo FET of the present invention is believed to offer performance advantages in several different types of electronic device applications. Such devices as laser receivers as are used in traffic law enforcement for example, automobile collision avoidance systems, infrared or optical spectrum camera equipment, fiber optic data transmission receivers and additional military hardware are believed to be ready applications of transistors fabricated according to the invention.

As disclosed herein, the photo FET of the invention is described in a generic sense with respect to its structure and its fabrication. This description also includes a gallium arsenide species of the described structure and fabrication. A somewhat related device which includes structure and fabrication involving an indium phosphide semiconductor material is described in the above-identified commonly owned and copending companion patent application.

Transistor devices fabricated with the gallium arsenide material disclosed herein display a peak response sensitivity in the 0.9 micrometer infrared wavelength range—as might be expected from the characteristics of a gallium arsenide based device. Such response peak is of course desirable for certain applications where infrared optical energy is to be detected. It is particularly interesting that frequency responses exceeding the two gigahertz range have also been noted for devices fabricated according to the invention. With optimization it is believed that frequency responses into an even higher range are achievable since GaAs MESFETs are inherently fast devices. Speeds approaching 8–10 Ghz have been observed, when devices are packaged in an appropriate high speed (RF) package.

An anti-reflective passivation coating can be expected to enhance the performance of the described device since it adds protection and eliminates spurious signals entering the FET region.

While the apparatus and method herein described constitute a preferred embodiment of the invention, it is to be understood that the invention is not limited to this precise form of apparatus or method and that changes may be made therein without departing from the scope of the invention which is defined in the appended claims.

I claim:

1. A partially fabricated gallium arsenide photo field effect transistor having a wide orthogonal angle optical port comprising:

a mesa structure comprised of three planar semiconductor layers supported on a single crystal gallium arsenide surrogate first substrate member, said semiconductor layers including an aluminum arsenide etch stop sacrificial first layer of 500 Angstroms thickness supported on said surrogate first substrate member, an n− gallium arsenide second layer of 1500 Angstroms thickness supported on said stop etch sacrificial first layer, and an n+ gallium arsenide third layer of 500 angstroms thickness supported on said second layer;

nickel-gold-germanium source and drain ohmic contacts received on an n+ gallium arsenide upper surface of said mesa and extending along mesa sidewall surfaces from said mesa upper surface to a portion of said surrogate first substrate member adjacent said mesa;

a recessed well located between said source and drain ohmic contacts in said mesa upper surface and extending completely through said third n+ gallium arsenide semiconductor layer and partially through said n− gallium arsenide second semiconductor layer to define a channel region depression therein;

a metallic Schottky barrier gate electrode received within said channel region depression of said recessed well on said second semiconductor layer, said metallic Schottky barrier gate electrode being formed from a material from the group consisting of titanium-gold or titanium-platinum-gold and aluminum;

a layer of electrically insulating filler material received over said surrogate first substrate member adjacent said mesa, over sidewall surface portions of said mesa, over said ohmic contacts received on said n+ gallium arsenide upper surface of said mesa and surrounding said metallic gate member in said recessed well;

a heat conductive epoxy adhesive layer received over said filler layer, over said gate electrode and on said ohmic contacts located on said mesa n+ gallium arsenide semiconductor layer upper surface; and a transistor-supporting permanent second substrate member attached by said adhesive layer, to said layer of electrically insulating filler material received over said surrogate first substrate member adjacent said mesa, to said metallic Schottky barrier gate electrode and to said ohmic contact metal located on said mesa upper surface;

whereby a subsequent removal of said single crystal gallium arsenide surrogate first substrate member and said aluminum arsenide etch stop sacrificial first layer achieves unobstructed wide angle orthogonally centered exposure of a light sensitive planar transistor input port.

2. The partially fabricated gallium arsenide photo field effect transistor of claim 1 wherein said aluminum arsenide etch stop sacrificial first layer includes an aluminum concentration of fifty percent;

said n− gallium arsenide second semiconductor layer comprises a silicon doping concentration of between two and four times ten to the seventeenth power ions per cubic centimeter; and said n+ gallium arsenide third semiconductor layer comprises a silicon doping concentration of between two and three times ten to the eighteenth power ions per cubic centimeter.

3. The partially fabricated gallium arsenide photo field effect transistor of claim 1 wherein said second supporting substrate member is comprised of one of the materials of glass, alumina, beryllium arsenide, gallium arsenide, silicon gallium arsenide, silicon, or a semiconductor material.

4. The partially fabricated gallium arsenide photo field effect transistor of claim 1 wherein said mesa structure includes a cross sectional shape in the form of a truncated pyramid having sloping sidewall surface portions.

5. The partially fabricated gallium arsenide photo field effect transistor of claim 1 wherein said source and drain ohmic contacts extending along mesa sidewall surfaces from said mesa upper surface to a portion of said surrogate first substrate member adjacent said mesa include electrical contact pad members disposed on said surrogate first substrate member adjacent said mesa.

6. The partially fabricated gallium arsenide photo field effect transistor of claim 1 wherein said heat conductive epoxy adhesive layer is comprised of Epoxy Technology Company type H74 adhesive.

7. A partially fabricated gallium arsenide photo field effect transistor having a subsequently removable surrogate substrate-covered, wide angle orthogonal path, unobstructed planar optical energy window, said photo field effect transistor comprising:

a plurality of field effect transistor-comprising planar semiconductor layers received on a horizontally disposed gallium arsenide surrogate first substrate member, said semiconductor layers including an aluminum arsenide etch stop sacrificial layer received over said surrogate first substrate member, an n− gallium arsenide layer received over said stop etch sacrificial layer, and an n+ gallium arsenide layer received over said n− gallium arsenide layer;

said semiconductor layers received on said surrogated first substrate member being laterally terminated in sloping orthogonal component-inclusive boundary lines defining sidewall portions of an upstanding transistor mesa, a transistor mesa having a crown surface comprising an exposed surface of said n+ gallium arsenide layer;

field effect transistor source and drain electrodes received on laterally opposed extremities of said mesa crown surface n+ gallium arsenide layer, said transistor source and drain electrodes having ohmic electrical connection with said n+ gallium arsenide layer at said mesa crown surface;

source and drain electrode-connected metal conductor members extending down laterally opposed sidewall portions of said mesa to contact pads located on laterally opposed surface regions of said surrogate first substrate member adjacent said mesa sidewall portions;

a gate well recess centrally disposed in said mesa crown surface intermediate said transistor source and drain electrodes and extending through said n+ gallium arsenide layer down to a gate recess region of reduced layer thickness in said n− gallium arsenide layer, a remaining thickness portion of said n− gallium arsenide layer below said gate recess region comprising a laterally extending charge carrier flow controlling channel region of said transistor;

a metallic gate member received over said laterally extending charge carrier flow controlling channel region in said gate recess region of said n− gallium arsenide layer, said metallic gate member having Schottky barrier electrical characteristics with respect to said n− gallium arsenide layer semiconductor material;

a layer of electrically insulating filler material covering said metal conductor members, said mesa sidewall portions, said contact pads, exposed surface regions of said surrogate first substrate member and also filling void regions of said gate well recess surrounding said metallic gate member; said layer of electrically insulating filler material having a planar upper surface disposed in coplanar relationship with upper surface portions of said metallic gate member and said source and drain electrode-connected metal conductor members;

a heat conductive epoxy adhesive layer received on said planar upper surface, said metallic gate member and said source and drain electrode-connected metal conductor members; and a permanent second substrate member attached by said adhesive layer to said filler material planar upper surface, said metallic gate member and said source and drain electrode-connected metal conductor members of said transistor;

whereby a subsequent removal of said gallium arsenide surrogate first substrate member and said aluminum arsenide etch stop sacrificial first layer exposes a light sensitive unobstructed wide angle orthogonal path planar optical input window backside surface of said laterally extending charge carrier flow-controlling channel region of said then second substrate member-supported photo field effect transistor.

8. The partially fabricated gallium arsenide photo field effect transistor of claim 7 wherein said vertically disposed lines defining sidewall portions of an upstanding transistor mesa are disposed at an acute angle with respect to a horizontally disposed surface of said gallium arsenide surrogate first substrate member.

9. The partially fabricated gallium arsenide photo field effect transistor of claim 7 wherein said layer of electrically insulating filler material is also comprised of an epoxy polymer.

10. The partially fabricated gallium arsenide photo field effect transistor of claim 7 wherein said field effect transistor source and drain electrodes comprise alloyed ohmic contact members comprised of nickel gold germanium material.

11. The partially fabricated gallium arsenide photo field effect transistor of claim 7 wherein said field effect transistor source and drain electrodes comprise refractory ohmic contact members comprised of germanium molybdenum tungsten alloy.

12. The partially fabricated gallium arsenide photo field effect transistor of claim 7 wherein said transistor is a metal semiconductor field effect transistor (a MESFET).

13. A partially fabricated photo field effect transistor having a subsequently removable surrogate substrate-covered wide angle orthogonal path optical energy window, said photo field effect transistor comprising:

a plurality of field effect transistor-related planar semiconductor layers received on a horizontally disposed surrogate first substrate member, said semiconductor layers including an etch stop sacrificial layer received on said surrogate first substrate member, a channel layer received over said etch stop sacrificial layer, and an ohmic contact layer received over said channel layer;

said semiconductor layers on said surrogated first substrate member being laterally terminated in trapezoid-side-like boundary lines defining sidewall portions of an upstanding transistor mesa, a transistor mesa having a crown surface comprising an exposed surface of said ohmic contact layer;

field effect transistor source and drain electrodes received on laterally opposed extremities of said mesa crown surface ohmic contact layer, said transistor source and drain electrodes having ohmic electrical characteristics with respect to said ohmic contact semiconductor layer at said mesa crown surface;

source and drain electrode-connected metal conductor members extending down opposed upward directed sidewall portions of said mesa to contact pads located on laterally opposed surface regions of said surrogate first substrate member supported stop etch sacrificial layer adjacent said mesa sidewall portions;

a gate well recess centrally disposed in said mesa crown surface intermediate said transistor source and drain electrodes and extending through said ohmic contact layer down to a gate recess region of reduced layer thickness in said channel layer, a remaining thickness portion of said channel layer below said gate recess region comprising a laterally extending charge carrier flow controlling channel region of said transistor;

a metallic gate member received over said laterally extending charge carrier flow controlling channel region in said gate recess region of said channel layer, said metallic gate member having Schottky barrier electrical characteristics with respect to said channel layer semiconductor material;

a layer of electrically insulating filler material covering said metal conductor members, said mesa sidewall portions, said contact pads, exposed surface regions of said surrogate first substrate member supported stop etch sacrificial layer and also filling void regions of said gate well recess surrounding said metallic gate member; said layer of electrically insulating filler material having a planar upper surface disposed in coplanar relationship with upper surface portions of said metallic gate member and said source and drain electrode-connected metal conductor members;

an attachment layer received on said planar upper surface, said metallic gate member and said source and drain electrode-connected metal conductor members;

a permanent second substrate member attached by said attachment layer to said filler material planar upper surface, said metallic gate member and said source and drain electrode-connected metal conductor members of said transistor;

whereby a subsequent removal of said surrogate first substrate member and said etch stop sacrificial layer exposes a wide angle orthogonal path light-responsive unobstructed planar optical input window backside surface of said laterally extending charge carrier flow controlling channel region of said then second substrate member-supported photo field effect transistor.

14. The partially fabricated photo field effect transistor of claim 13 wherein said attachment layer is comprised of one of the materials of an epoxy adhesive layer, an aluminum nitride layer and a diamond layer.

15. The partially fabricated photo field effect transistor of claim 13 wherein said attachment layer is comprised of a thermally conductive particle-filled epoxy adhesive layer.

16. The partially fabricated photo field effect transistor of claim 13 wherein said semiconductor layers each include gallium arsenide semiconductor material.

17. The partially fabricated photo field effect transistor of claim 13 wherein said surrogate first substrate member is comprised of single crystal semiconductor material.

18. The partially fabricated photo field effect transistor of claim 13 wherein said second substrate member is comprised of one of the materials of glass, alumina, beryllium arsenide, gallium arsenide, silicon gallium arsenide, silicon, or another semiconductor material.

19. The partially fabricated photo field effect transistor of claim 13 wherein said channel layer and said ohmic contact layer are comprised of n– doped gallium arsenide and n+ doped gallium arsenide respectively.

20. The partially fabricated photo field effect transistor of claim 13 wherein said metallic gate member is comprised of one of the materials of titanium-gold or titanium-platinum-gold.

21. A substrate-replaced, secondary substrate-supported, upside down light sensitive field effect transistor having an unobstructed wide angle orthogonal path planar radiant energy input aperture, said transistor comprising:

a planar secondary substrate member;

first and second electrically segregated metallic conductor members disposed over said planar secondary substrate member;

an ohmic contact first layer of doped semiconductor material overlaying said first and second electrically segregated metallic conductor members and electrically connected at opposite first layer ends with respective of said first and second metallic conductor members in transistor source and drain ohmic junctions;

a charged carrier-communicating second layer, a transistor channel layer, of semiconductor material overlaying said ohmic contact first semiconductor layer;

said semiconductor layers being disposed in single crystal crystalline structure with respect to each other and with respect to crystalline structure of a removed primary substrate member on which said channel layer and said ohmic contact layer were respectively initially formed;

a well recess region extending upward from said planar secondary substrate member through said ohmic contact semiconductor layer and partly through said charged carrier-communicating semiconductor channel layer to a transistor active region sub layer portion of said channel layer, said well recess region being laterally located between said transistor source and drain ohmic junctions in said semiconductor layers;

a transistor metallic gate member disposed in said well recess region and extending upward therein from said planar secondary substrate member to a lower surface of said channel layer transistor active region sub layer, said transistor metallic gate member connecting also to a gate connector pad member located on a rearward surface portion of said planar secondary substrate member; and a layer of electrically insulating filler material disposed on said planar secondary substrate member and surrounding said semiconductor material layers, a portion of said first and second metallic conductor members extending upward through a thickness dimension portion of said electrically insulating filler material to electrical contact pads received on an upper surface portion of said electrical insulating filler material;

said active region sub layer portion of said transistor channel layer having an open upper surface comprising said unobstructed planar wide angle orthogonal path radiant energy input aperture of said field effect transistor.

* * * * *